United States Patent

Seamons et al.

[11] Patent Number: 6,060,397
[45] Date of Patent: *May 9, 2000

[54] GAS CHEMISTRY FOR IMPROVED IN-SITU CLEANING OF RESIDUE FOR A CVD APPARATUS

[75] Inventors: Martin Seamons, Santa Clara; Cary Ching, Sunnyvale, both of Calif.; Kou Imaoka, Sakura; Tatsuya Sato, Narita, both of Japan; Tirunelveli S. Ravi, Santa Clara, Calif.; Michael C. Triplett, Essex Junction, Vt.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/502,688

[22] Filed: Jul. 14, 1995

[51] Int. Cl.⁷ .................................................. H01L 21/00
[52] U.S. Cl. ..................... 438/694; 438/787; 438/905; 134/1.1; 216/37; 216/67
[58] Field of Search ................................. 118/715, 723 R, 118/723 E; 156/643.1, 646.1, 345; 216/37, 67, 71; 134/1.1, 22.1; 438/694, 787, 905

[56] References Cited

U.S. PATENT DOCUMENTS

| | | | |
|---|---|---|---|
| 3,806,365 | 4/1974 | Jacob | 134/1 |
| 4,402,758 | 9/1983 | Hobbs | 134/3 |
| 4,615,761 | 10/1986 | Tada et al. | 156/345 X |
| 4,657,616 | 4/1987 | Benzing et al. | 156/345 |
| 4,877,482 | 10/1989 | Knapp et al. | 156/643 |
| 4,960,488 | 10/1990 | Law et al. | 156/643.1 |
| 5,011,705 | 4/1991 | Tanaka | 427/39 |
| 5,035,751 | 7/1991 | Nagashima et al. | 134/22.1 |
| 5,039,388 | 8/1991 | Miyashita et al. | 204/192.32 |
| 5,057,187 | 10/1991 | Shinagawa et al. | 156/643 |
| 5,129,958 | 7/1992 | Nagashima et al. | 134/22.1 |
| 5,131,752 | 7/1992 | Yu et al. | 356/369 |
| 5,158,644 | 10/1992 | Cheung et al. | 156/643 |
| 5,207,836 | 5/1993 | Chang | 134/1 |
| 5,221,423 | 6/1993 | Sugino et al. | 156/643 |
| 5,252,178 | 10/1993 | Moslehi | 156/643 |
| 5,260,236 | 11/1993 | Petro et al. | 437/241 |
| 5,269,881 | 12/1993 | Sekiya et al. | 156/643 |
| 5,281,302 | 1/1994 | Gabric et al. | 156/643 |
| 5,286,297 | 2/1994 | Moslehi et al. | 118/723 E |
| 5,294,262 | 3/1994 | Nishimura | 134/22.1 |
| 5,356,478 | 10/1994 | Chen et al. | 134/1 |
| 5,380,370 | 1/1995 | Niino et al. | 134/22.11 |
| 5,380,397 | 1/1995 | Fukuyama et al. | 156/643 |
| 5,413,670 | 5/1995 | Langan et al. | 156/643.1 X |
| 5,425,842 | 6/1995 | Zijlstra | 156/643.1 |
| 5,517,943 | 5/1996 | Takahashi | 118/715 |

FOREIGN PATENT DOCUMENTS

| | | | |
|---|---|---|---|
| 0 247 603 A2 | 12/1987 | European Pat. Off. | H01L 21/31 |
| 0 464 696 AI | 1/1992 | European Pat. Off. | H01L 21/00 |
| 61-216318 | 9/1986 | Japan | H01L 21/205 |
| 3-277788 | 9/1991 | Japan | C23F 4/00 |
| 4-115536 | 4/1992 | Japan | H01L 21/3205 |
| 6-208972 | 7/1994 | Japan | H01L 21/302 |

Primary Examiner—Thi Dang
Attorney, Agent, or Firm—Townsend and Townsend and Crew

[57] ABSTRACT

A method (100) of cleaning residues from a chemical vapor deposition apparatus (10) is provided. The present method (100) includes introducing into a chamber (12) cleaning gases such as $N_2$, $C_2F_6$, and $O_2$, and forming a plasma from the cleaning gases. The present method also includes removing residues from interior surfaces of the chamber 12 by forming a volatile product from the residues and at least one of the cleaning gases.

32 Claims, 5 Drawing Sheets

GAS CHEMISTRY FOR IMPROVED IN-SITU CLEANING OF RESIDUE FOR A CVD APPARATUS

BACKGROUND OF THE INVENTION

The present invention relates to the fabrication of integrated circuits. More particularly, the invention provides a technique, including a method and apparatus, for cleaning interior surfaces of a chemical vapor deposition (CVD) treatment chamber. The present invention also may be applied to an apparatus for plasma etching, physical vapor deposition (PVD), and the like.

In the manufacture of high density integrated circuits, commonly termed VLSI devices, contaminant particles are a major problem. In particular, contaminant particles attach themselves to unpassivated elements of integrated circuit devices during fabrication, where they can create short circuits or cause reliability problems. Therefore, the contaminant particles ultimately reduce the yield of good dies on a conventional semiconductor wafer. Even worse, as feature sizes decrease, the influence of contaminant particles in the fabrication of integrated circuits becomes greater.

Accordingly, semiconductor equipment vendors and users, alike, often rely upon elaborate and expensive techniques to control potential sources of contaminant particles. Such techniques include the use of ultra-clean rooms, super automated handling equipment, and sophisticated process controls during the fabrication of integrated circuits to reduce the potential sources of contaminant particles. However, such techniques can only be of limited success because substantial amounts of contaminant particles in integrated circuit fabrication are actually derived from reactant by-products created when semiconductor wafers undergo processing.

These reactant by-products often attach themselves to interior surfaces of a process chamber and form into a "thick" contaminant residue layer. Typically, the contaminant residue layer is derived from by-products from reactant gases and other by-products already attached to interior surfaces of the process chamber. Portions of the contaminant residue layer can flake off and deposit onto unpassivated surfaces of the integrated circuit, thereby damaging such integrated circuit by causing short circuits, broken connections, missing elements, and reliability problems.

In a conventional silicon dioxide deposition process, for example, the reactant gases used are predominately mixtures of organic silane and ozone. These gases are introduced into the chamber to form a silicon dioxide layer on surfaces of a semiconductor wafer. As the silicon dioxide layer is formed, however, these gases also form particulate compositions. The particulate compositions form loosely attached contaminant residues on the interior surfaces of the process chamber. These interior surfaces of the chamber include a dispersion head, electrodes, walls, and any other exposed surfaces. The loosely attached contaminant residues often form into a thicker contaminant residue layer, which is likely to flake off and fall onto the integrated circuit.

To prevent portions of the contaminant residue layer from damaging the integrated circuit, a variety of cleaning techniques have been proposed. These cleaning techniques require separate process steps, which include machine shut-down and cleaning, after each deposition step. This is time consuming, expensive, and difficult to achieve. Of course, when the system is not operating, its throughput drops, rendering the manufacturing process all the more expensive.

An example of a conventional cleaning technique for a silicon dioxide deposition apparatus involves sequential steps of machine shut-down, dismantling portions of the process chamber, and hand wiping interior surfaces of the process chamber using appropriate materials, e.g. rinse water and clean wipes. The hand wiping step attempts to remove contaminant residues from the interior surfaces. Other conventional cleaning techniques sometimes used rely upon hand wiping the interior surfaces of the process chamber with a liquid chemical solution, such as a dilute hydrofluoric acid solution, or an organic solvent, in an attempt to dissolve and remove the contaminant residues. These conventional cleaning techniques also are applied to vacuum exhaust channels and pump systems because diminished vacuum or suffocation often occurs with accumulated residues or contaminant clogging. The conventional techniques are time consuming, and generally provide additional sources for even more contamination.

Plasma enhanced dry cleaning techniques have also been used to remove contaminant residues from interior surfaces of a deposition chamber. The dry cleaning techniques often take place during a separate process step, for example, by introducing cleaning gases into a process chamber, striking a plasma from the cleaning gases, and using the plasma to remove contaminant residues. Preferably, ionic species in the plasma combine with the contaminant residues to form volatile products which are removed from the process chamber. The dry cleaning techniques typically must be used after every deposition run to be effective in keeping the interior surfaces of the process chamber substantially free from contaminant residues. Accordingly, the dry cleaning techniques consume valuable production time, and decrease machine availability or machine up-time. The use of dry cleaning techniques every deposition run also consumes cleaning gases, which can be expensive and difficult to obtain. Further, dry cleaning techniques often remove portions of the actual chamber surfaces by an etching reaction.

From the above, it can be seen that a technique for removing contaminant particles from a process chamber which reduces the amount of machine downtime would be desirable.

SUMMARY OF THE INVENTION

The present invention provides a technique, including a method and apparatus, for cleaning contaminant residues from interior surfaces of a deposition chamber. The invention relies upon a cleaning technique using a combination of gases, including nitrogen, to remove the contaminant residues between multiple deposition runs in an easy and cost effective manner.

A method for cleaning residues from a deposition chamber according to the present invention uses nitrogen gas in the dry clean plasma. The method includes steps of introducing into a chamber cleaning gases comprising $N_2$, $C_2F_6$, and $O_2$, and forming a plasma from the cleaning gases. The method also includes removing residues from interior surfaces of the chamber by forming a volatile product from the residues and at least one of the cleaning gases.

A method of fabricating an integrated circuit device according to the present invention uses an in-situ plasma cleaning technique with nitrogen gas. The method includes steps of providing a chamber for chemical vapor deposition and introducing a wafer into the chamber. Gases are introduced into the chamber to form a layer of silicon dioxide overlying the wafer, and to further form reactant byproducts as residues on interior chamber surfaces. Multiple deposition runs are performed. After the last wafer is removed from the chamber, cleaning gases comprising $N_2$, $C_2F_6$, and $O_2$ are introduced. A plasma is formed from the cleaning gases, and the residues on the interior surfaces of the chamber are removed as volatile products. This sequence of steps provides chamber cleaning during fabrication operations for integrated circuits. Preferably, many wafers are processed between cleaning operations.

An apparatus according to the present invention uses cleaning gases such as a nitrogen containing compound and a fluorine containing compound. The apparatus includes a chamber having an interior surface. A contaminant residue is attached to the interior surface. A gas distribution means is mounted in the chamber. The gas distribution means can be used to introduce the cleaning gases. A power source mounted to the chamber provides a voltage at a selected frequency, which is used to form a plasma from the cleaning gases. An exhaust removes a volatile product of the residue formed by an interaction with the residue and one of the cleaning gases.

The present invention achieves these benefits in the context of known process technology. However, a further understanding of the nature and advantages of the present invention may be realized by reference to the specification and attached drawings.

DESCRIPTION OF THE SPECIFIC EMBODIMENT

Figure 1:
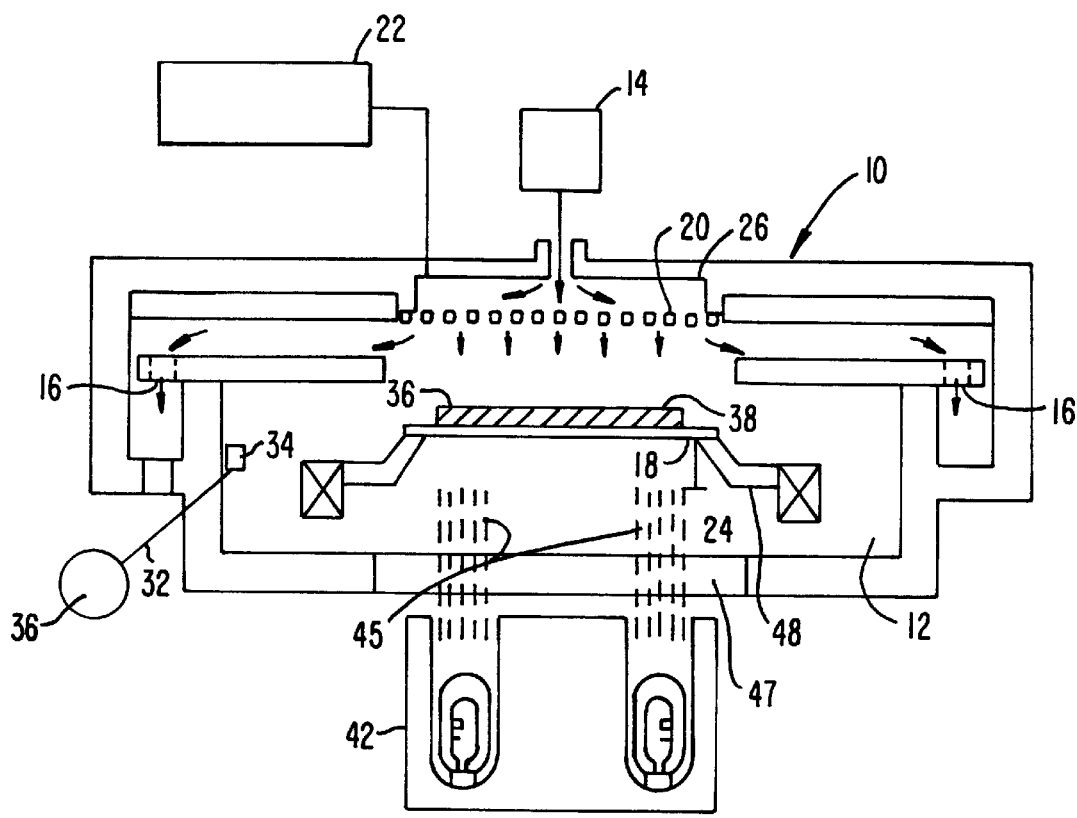
FIG. 1 is a simplified CVD apparatus according to the present invention.

FIG. 1 is a simplified CVD apparatus 10. The apparatus includes a chamber 12, a feed source 14, an exhaust 16, a pedestal or susceptor 18, a gas distribution plate 20, an RF power source 22, a ground 24, an electrode (also the intake manifold) 26, and other elements. The chamber can be any suitable chamber capable of housing a product 36, such as a wafer for deposition, and of providing a plasma discharge therein. In operating this chamber, a plasma is formed adjacent to the wafer by RF energy applied to electrode 26 from the RF power source 22 while susceptor 18 is grounded. Power source 22 can supply either single or dual frequency RF power to the electrode 26 enhancing the decomposition of chemical species introduced into the chamber 12.

A lamp reflector module 42 provides a collimated annular pattern of light 45 through a quartz window 47 onto an annular outer periphery of susceptor 18. This light pattern provides distributed heat to the susceptor used for wafer heating. Such heat distribution compensates for the natural heat loss from the susceptor and provides a rapid and a more uniform distribution of heat to the susceptor.

The chamber lining, support fingers 48, and various other reactor hardware are made of material such as aluminum, coated with a dielectric material such as anodized aluminum oxide. This chamber surface, even after multiple wafer runs, remains clean during deposition of a dielectric material, e.g., silicon dioxide or the like. An apparatus of this type is described in U.S. Pat. No. 5,000,013, commonly assigned.

A partially completed semiconductor wafer 36 having an upper surface 38 is placed into the present CVD apparatus for deposition, e.g., chemical vapor deposition (CVD), sub-atmospheric chemical vapor deposition (SACVD), low pressure chemical vapor deposition (LPCVD), atmospheric pressure chemical vapor deposition (APCVD), plasma enhanced chemical vapor deposition (PECVD), and others. Examples of deposition materials include a dielectric material such as a silicon dioxide ($SiO_2$), a phosphosilicate glass (PSG), a fluorophosphosilicate glass (FPSG), a borophosphosilicate glass (PSG), a silicon nitride ($Si_3N_4$), among others.

In operation, the deposition occurs by introducing a mixture of organic silane and oxygen gas, and striking a plasma from these gases. The organic silane can be any suitable organic silicate material such TEOS, HMDS, OMCTS, and the like. The oxygen percentage relative to TEOS is typically 20% and less. A deposition temperature ranges from about 300 to about 500° C., and also can be at other temperatures. Deposition also can occur by substituting ozone for the oxygen gas. Of course, other concentrations, temperatures, materials, and flow rates can be used depending upon the particular application.

Contaminant residues form on interior surfaces of the reactor such as the reaction chamber 12, electrode 26, pedestal 18, gas distribution plate 20, and other surfaces. During processing of the partially completed semiconductor wafer 36, such residues often fall off (or flake off) such interior surfaces onto the top surface 38. Such particles are detrimental to the manufacture of the wafer, and in particular to each integrated circuit device thereon.

According to an embodiment of the present invention, the residues are removed by introducing a selected group of cleaning gases into the reaction chamber after a number of deposition steps. The selected group of cleaning gases includes a combination of a fluorine containing compound such as $CF_4$, $C_2F_6$, $C_3F_8$, $SF_6$, interhalogens, and the like, and a nitrogen containing compound such as $N_2$, $NF_3$, $N_2O$, and others. The fluorine containing compound is preferably $C_2F_6$ gas, and the nitrogen containing compound is preferably $N_2$ gas. The combination of the aforementioned gases can be mixed with an $O_2$ containing gas. Alternatively, $N_2O$ gas may be combined with the fluorine containing compound without an $O_2$ containing gas.

In a preferred embodiment, the $C_2F_6$, the $N_2$, and the $O_2$ gases are introduced into the reaction chamber according to selected flow rates. The $C_2F_6$ gas flow rate ranges from about 200 sccm to about 5,000 sccm, or preferably ranges from about 550 sccm to about 650 sccm, and is more preferably at about 600 sccm. The $O_2$ gas flow rate ranges from about 200 sccm to about 5,000 sccm, or preferably ranges from about 550 sccm to about 650 sccm, and is more preferably at about 600 sccm. The $N_2$ gas flow rate ranges from about 20 sccm to about 500 sccm, or preferably ranges from about 250 to about 350 sccm, and is more preferably at about 300 sccm. A greater total flow rate generally provides a faster cleaning time. A combined total flow rate exceeding about 1,800 sccm does not substantially decrease cleaning time, but does tend to increase the amount of gases used. This increases costs associated with the use of more cleaning gases. Of course, the particular flow rates used depend upon the application.

In the preferred embodiment, the $C_2F_6$, the $N_2$, the $O_2$ gases are introduced into the reaction chamber at the selected conditions. The ratio of $C_2F_6:O_2$ is about 1:1, but also can be at other ratios. Other cleaning parameters include a pressure ranging from about 1.5 to about 6.5 Torr, and is preferably at about 4.0 Torr. A pressure exceeding 7.0 Torr confines the plasma to inner surfaces of the chamber, and therefore reduces cleaning of outer chamber surfaces, e.g., inner walls, etc. The susceptor temperature ranges from about 300° C. to about 500° C., and is preferably at about 400° C. The inner chamber wall temperature ranges from about 50° C. to about 70° C., and is preferably about 60° C. Power ranges from about 700 Watts to about 2,000 Watts, and is preferably at about 1,000 Watts. The power also can be supplied at low frequencies (200 kHz–400 kHz) or at a high frequency, e.g., 13.56 MHz. The electrode spacing ranges from about 200 mils to about 2,000 mils, and is preferably at about 1,000 mils or more. Of course, the gases and selected deposition parameters will depend upon the particular application.

The combination of the $C_2F_6$, the $N_2$, and the $O_2$ gases reduces the likelihood of arcing in the chamber. In particular, the combination of these gases reduces the electrical potential between the electrode and the pedestal or other surfaces. In an embodiment, the electrical potential is lower by about 10 volts to about 30 volts, and is preferably lower than about 20 volts from the conventional techniques. The lower potential reduces the amount of arcing and thereby substantially eliminates any damage created by the arcing.

Using the preferred combination of gases, the oxygen containing gas does not create an insoluble $Al_xO_xF$ compound which is formed using the conventional techniques. In particular, the combination of these gases create volatile products, such as silicon type products, minimal amounts of $AlCl_3$, and others, which are removed from the chamber through the exhaust. As volatile products, substantially no residual particles are introduced into the chamber via the present cleaning method.

Optionally, the present CVD apparatus is adapted with an endpoint detection system 32. The endpoint detection system identifies an "endpoint" for the present cleaning method by monitoring the presence of selected radicals in the plasma. The endpoint detection system uses, for example, a photodiode 34 to monitor a signal derived from a selected wavelength of visible radiation. In an embodiment, as the signal increases the chamber becomes cleaner up to a point where the chamber is clean enough for later processing. Alternatively, the signal decreases as the chamber becomes cleaner to a point where the chamber is substantially clean for later processing. At such point, the endpoint detection system sends a signal to a system controller 36, and stops the cleaning method automatically. Of course, other systems for detecting cleaning endpoint also may be used depending upon the particular application.

Figure 2:
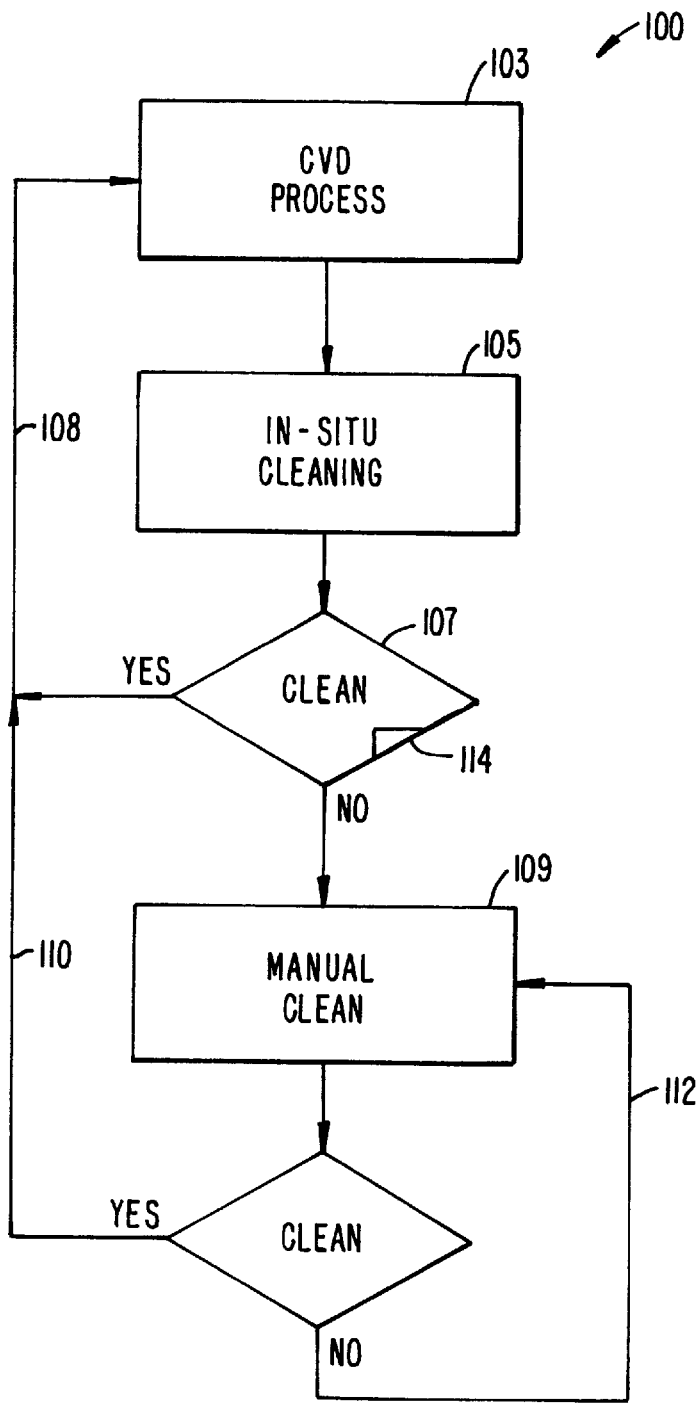
FIG. 2 is a simplified cross-sectional view of a semiconductor integrated circuit according to the present invention.

FIG. 2 is a simplified flow diagram 100 for a preferred cleaning method according to the present invention. The flow diagram is merely an illustration. The flow diagram includes steps of performing a CVD process (step 103) for "n" runs, where "n" is a number greater than one, and is preferably a number greater than five. In a preferred embodiment, a CVD process for silicon dioxide includes an "n" greater than two to greater than ten. An example of such CVD process includes LPCVD, APCVD, SACVD, PECVD, or the like. Of course, the deposition process and the number (n) of runs will depend upon the particular application.

In a specific embodiment, an in-situ cleaning process (step 105) occurs after "n" runs, where "n" is defined by at least one of the following parameters. In one embodiment, "n" refers to an upper limit of runs where the CVD apparatus operates below a selected particle count threshold limit. In an alternative embodiment, "n" refers to an upper limit of runs where the CVD apparatus operates above a selected uniformity limit. In a further alternative embodiment, "n" refers to an upper limit of runs where the CVD apparatus operates within a selected deposition rate. In an embodiment for cleaning residues from a CVD apparatus, "n" ranges from about one to about fifty, and is preferably more than two, and is more preferably more than ten. Of course, "n" also can depend upon combinations of the aforementioned parameters such as particle count, uniformity, deposition rate, and others.

The in-situ cleaning process can select cleaning gases according to the present invention. The cleaning gases include a combination of a fluorine containing compound such as $C_2F_6$, $CF_4$, $SF_6$, and the like, and a nitrogen containing compound such as $NF_3$, $N_2O$, $N_2$, and others. The fluorine containing compound and nitrogen containing compounds are preferably mixed with an oxygen containing compound such as $O_2$, and others. Preferably, the fluorine compound is $C_2F_6$ gas, the nitrogen compound is $N_2$ gas, and the oxygen compound is $O_2$ gas. These gas are provided at the flow rates described above. The method can also use $N_2O$ gas and $C_2F_6$ gas without oxygen.

In step 107, the present method returns via branch 108 to the deposition process for another "n" runs when interior surfaces of the CVD apparatus are "clean". After "n" runs the present method performs another in-situ cleaning process. The sequence of steps 103, 105, and 107 occurs until "m" cycles have been repeated. Alternatively, the CVD process can be cleaned by clean wipes and water (step 109) after "m" in-situ cleaning processes. The clean wipes and water remove any remaining residues from interior surfaces of the CVD chamber. After removing the residues from the interior surfaces, the present method returns to the CVD process via branch 110. Alternatively, the present method returns to step 109 via branch 112.

The present method optionally includes a step of "endpoint" detection (step 114). The endpoint detection method monitors a signal (and its strength) derived from a selected wavelength of visible radiation from chemical radicals in the cleaning plasma. The degree of cleanliness is determined by the strength of the signal. In an embodiment, changes in the signal strength are monitored as the chamber becomes cleaner up to a point where the chamber is clean enough for later processing. At such point, the endpoint detection method sends a "stop" signal to a system controller, and shuts down the cleaning method automatically.

In a preferred embodiment, the method relies upon signals from fluorine radicals in the cleaning plasma. For example, using a fluorine containing compound, a nitrogen containing gas, and an oxygen containing gas as the cleaning recipe, the endpoint detection method monitors an intensity at a selected wavelength of about 704 nm visible radiation for the presence of fluorine radicals. A lower signal intensity relates to a "dirty" chamber since the fluorine radicals combine with residues to form volatile products which do not emit the signal at the 704 nm visible radiation. A higher signal intensity relates to a "clean" chamber since the concentration of fluorine radicals increases. The greater concentration of fluorine radicals increases the signal intensity at the 704 nm visible radiation.

The present method stops the cleaning process when the concentration of fluorine radicals reflects a saturated state. A saturated state generally relates to a point when the concentration of fluorine in the CVD chamber does not increase at a selected flow rate. In a specific embodiment, the cleaning method occurs for an additional time measured in percentage of about 5% to about 30% over the time necessary to first clean the chamber or after the endpoint has been detected. In a preferred embodiment, the additional cleaning time is about 20% over the cleaning time after the endpoint has been detected. Of course, other systems for detecting cleaning endpoint also may be used depending upon the particular application.

The aforementioned sequence of steps may be performed with a single step cleaning method according to the present invention. Alternatively, the cleaning method using the selected gases may be performed using a multi-step cleaning process. Examples of a multi-step cleaning process may adjust electrode spacing to selectively clean both inner and outer surfaces of the interior walls of the chamber and other surfaces. Of course, the technique used depends upon the particular application.

Figure 3:
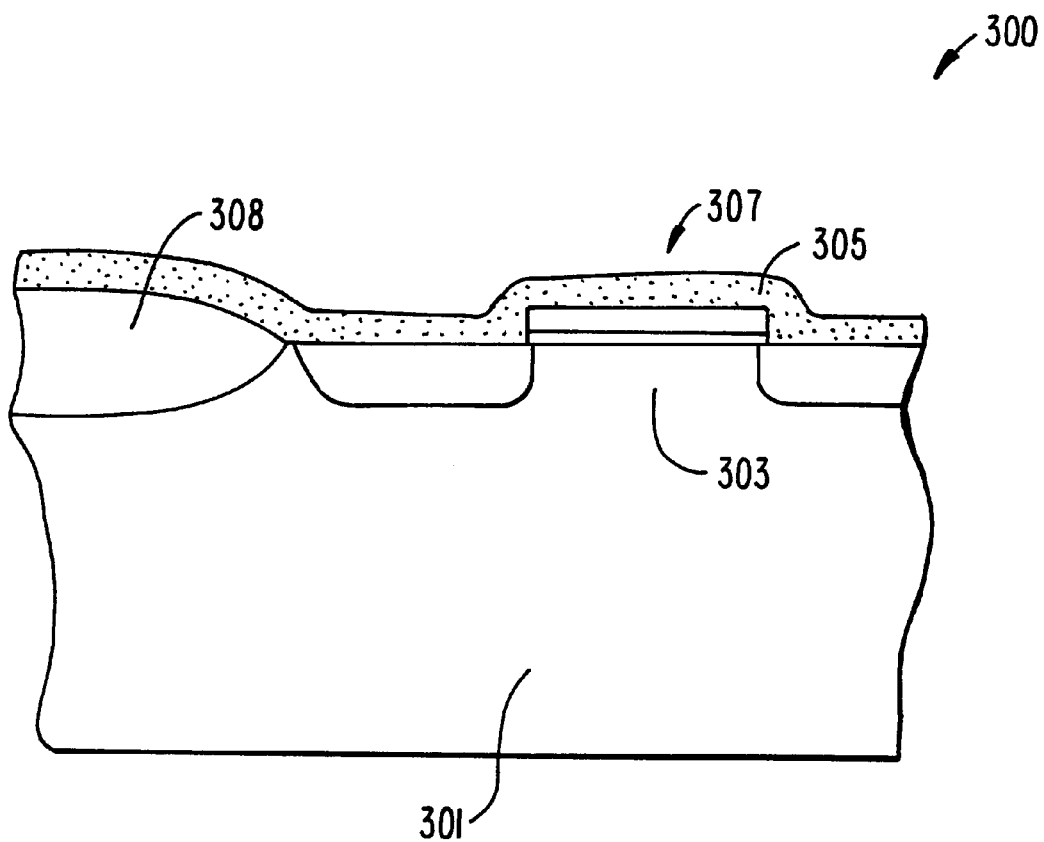
FIG. 3 is a simplified flow diagram for an alternative CVD method according to the present invention.

FIG. 3 is a simplified cross-sectional view of an integrated circuit 300 fabricated according to an embodiment of the present invention. The integrated circuit includes a field effect transistor 307 and other elements. The device depicted is for illustrative purposes only; one of ordinary skill the art can implement the present method for fabrication of other integrated circuits such as application specific integrated circuits, microprocessors, memory circuits, and others. As shown, the integrated circuit device includes a substrate 301, an active region 303, a field isolation oxide region 308, and an overlying dielectric layer 305 made by way of the present invention.

The dielectric layer is preferably a silicon dioxide layer. The silicon dioxide layer is substantially free from particles such as aluminum oxy-fluoride and the like. The silicon dioxide layer has a uniformity of less than about 2%, and is preferably less than about 1%, and is more preferably less than about 0.5%. The silicon dioxide layer has a wafer-to-wafer uniformity of less than about 3.0%, and is preferably less than about 1.5%. By way of the present method, multiple wafers are processed before cleaning, and each wafer is within the selected parameters noted above.

EXAMPLES

To demonstrate the operation of the apparatus and method, experiments were performed using the following parameters. A PECVD chamber made by Applied Materials, Inc., was adapted with kits in the experiments. Silicon wafers were used to replicate the actual production operation of depositing silicon dioxide on the wafers. The parameters in the experiments should not be limiting to the claims as described herein. One of ordinary skill in the art also can use other chemicals, chamber parameters, and conditions.

Figure 4:
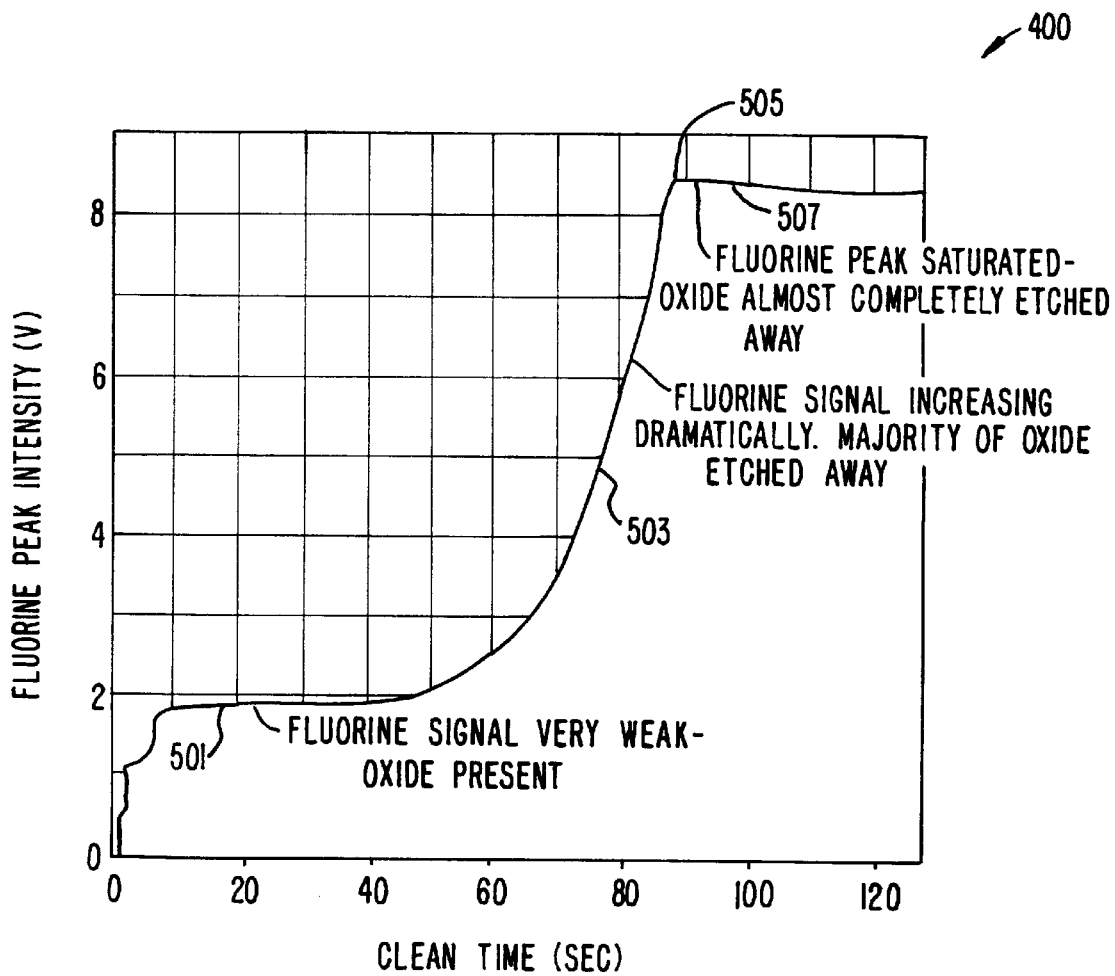
FIGS. 4–5 illustrate experimental results according to the present invention.
Figure 5:
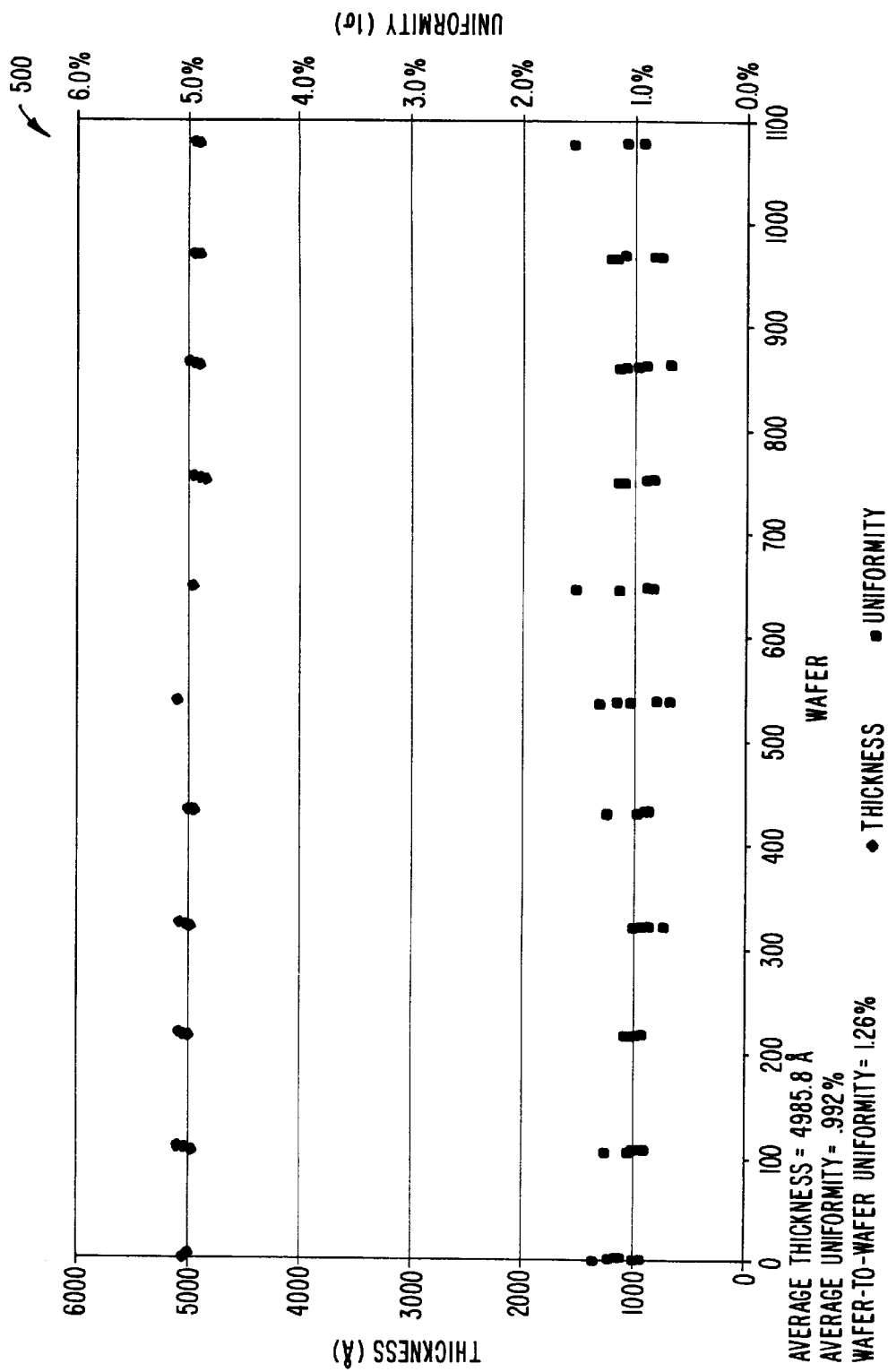

FIGS. 4–5 illustrate selected parameters that were monitored during experiments according to the present invention. In particular, FIG. 4 is a simplified plot 400 of fluorine intensity (V) against cleaning time, and can be used to detect for the cleaning endpoint. The cleaning method in the experiment used a $C_2F_6$ gas, an $O_2$ gas, and a $N_2$ gas. The flow rate of $C_2F_6$ gas was about 600 sccm, the flow rate of $O_2$ gas was about 600 sccm, and the flow rate $N_2$ gas was about 300 sccm. The chamber pressure was about 4 Torr, an electrode spacing of about 1,000 mils, and a temperature of about 400° C. The cleaning method was also operated at a power of about 1,000 Watts. As shown, the fluorine intensity began at zero (0) at time zero (0), and increased exponentially until about ninety (90) seconds. A weak fluorine signal 501 represents presence of residues, while an increasing fluorine signal 503 represents a decreasing amount of residues. A peak fluorine signal 505 indicates that substantially all of the residues have been etched away. The endpoint 507 is detected during the peak fluorine signal.

FIG. 5 is a simplified plot 500 of thickness and uniformity for dielectric layers using a cleaning method according to the present invention. In the experiment, a cleaning step was performed after every five wafers of deposition. The deposition produced an average thickness of about 4985.8 Å of dielectric material. The dielectric layer had an average uniformity of about 0.922%, and a wafer-to-wafer uniformity of about 1.26%. As shown, thicknesses are plotted in "black diamonds" and the uniformities are plotted as "black squares." The simplified plot establishes that the present cleaning method produces good uniformities and dielectric material thicknesses.

Experiments were also performed using the parameters listed in Table 1. The experiments show that the single cleaning step using, for example, the combination of $C_2F_6$, $N_2$, and $O_2$ gases takes advantage of standard fabrication chemicals, thereby saving costs and the like.

TABLE 1

Experimental Results For Cleaning Methods

| PARAMETER | $N_2$ CLEAN | $NF_3$ CLEAN | 2-STEP CLEAN (inner/outer) | |
|---|---|---|---|---|
| Time for 1 μm (sec.) | 90 | 85 | 55 | 45 |
| Temp. (° C.) | 0 | 0 | 400 | 400 |
| RF Power (Watts) | 1000 | 1000 | 950 | 950 |
| Spacing (mils.) | 999 | 999 | 180 | 999 |
| Pressure (Torr.) | 4 | 4 | 9.5 | 1.8 |
| $O_2$ (sccm) | 600 | 600 | 950 | 950 |
| $C_2F_6$ (sccm) | 600 | 600 | 900 | 900 |
| He (sccm) | 0 | 600 | 0 | 0 |
| $NF_3$ (sccm) | 0 | 45 | 0 | 75 |
| $N_2$ (sccm) | 300 | 0 | 0 | 0 |
| Total Flow (sccm) | 1500 | 1845 | 1850 | 1925 |
| Clean Gas (cost $/μm) | .20 | .34 | .50 | |

As can be seen from Table 1, the present single step cleaning method uses readily available fabrication chemicals such as $N_2$, $C_2F_6$, and $O_2$ gases. This provides low gas costs, and lower cleaning costs. The present single step cleaning method takes less time than the two-step method, and is therefore the preferred embodiment. Less time generally translates into higher throughput and lower costs associated with cleaning.

While the above is a full description of the specific embodiments, various modifications, alternative constructions and equivalents may be used. For example, while the description above is in terms of a cleaning a CVD apparatus chamber, it would be possible to implement the present invention with plasma etching chambers, or the like.

Therefore, the above description and illustrations should not be taken as limiting the scope of the present invention defined by the appended claims.

What is claimed is:

1. A method for cleaning a residue from an interior surface of a chemical vapor deposition apparatus, said method comprising steps of:

introducing into a chamber of said chemical vapor deposition apparatus cleaning gases comprising $N_2$, $C_2F_6$, and $O_2$, and forming a plasma from said cleaning gases; and removing from said chamber a volatile product of said residue formed by an interaction with said residue and at least one of said cleaning gases.

2. The method of claim 1 wherein said chamber is maintained at a pressure ranging from about 2 to about 6 Torr.

3. The method of claim 1 wherein said chamber includes a susceptor maintained at a temperature of about 300 to about 500° C.

4. The method of claim 1 wherein said $N_2$ is provided at a flow rate of about 20 to about 500 sccm.

5. The method of claim 6 wherein said $C_2F_6$ and said $O_2$ are provided at a flow rate ratio ($C_2F_2:O_2$) of about 1:1.

6. The method of claim 1 wherein said $O_2$ is provided at a flow rate of about 200 to about 5,000 sccm.

7. The method of claim 1 wherein said chamber includes electrodes having radio frequency power at about 700 to about 2,000 Watts.

8. The method of claim 1 further comprising steps of:

introducing a wafer into said chamber;

forming a silicon dioxide layer overlying said wafer;

removing said wafer from said chamber of said chemical vapor deposition apparatus; and repeating said steps of introducing, forming, and removing for at least two wafers.

9. The method of claim 1 further comprising steps of:

introducing a wafer into said chamber;

forming a silicon dioxide layer overlying said wafer;

removing said wafer from said chamber of chemical vapor deposition apparatus; and repeating said steps of introducing, forming, and removing for at least five wafers.

10. A method of fabricating an integrated circuit device, said method comprising steps of:

introducing a wafer into a chamber;

introducing gases into said chamber to form a layer of silicon dioxide overlying said wafer, said gases further forming a residue on interior surfaces of said chamber;

removing said wafer;

introducing into said chamber cleaning gases comprising $N_2$, $C_2F_6$, and $O_2$, and forming a plasma from said cleaning gases; and removing from said chamber a volatile product of said residue formed by an interaction with said residue and at least one of said cleaning gases.

11. The method of claim 10 wherein said chamber is maintained at a pressure ranging from about 2 to about 6 Torr.

12. The method of claim 10 wherein said chamber includes a susceptor maintained at a temperature of about 300 to about 500° C.

13. The method of claim 10 wherein said $N_2$ is provided at a flow rate of about 250 to about 350 sccm.

14. The method of claim 10 wherein said $C_2F_6$ and said $O_2$ are provided at a flow rate ratio ($C_2F_2:O_2$) of about 1:1.

15. The method of claim 10 wherein said $O_2$ is provided at a flow rate of about 550 to about 650 sccm.

16. The method of claim 10 wherein said chamber includes electrodes connected to radio frequency power of about 700 to about 2,000 Watts.

17. A method of fabricating an integrated circuit device, said method comprising steps of:

(a) introducing a wafer into a chamber;

(b) introducing gases into said chamber to form a layer of silicon dioxide overlying said wafer, said gases further forming a residue on interior surfaces of said chamber;

(c) removing said wafer;

(d) repeating steps (a) through (c) for more than one wafer;

(e) introducing into said chamber cleaning gases comprising $N_2$, $C_2F_6$, and $O_2$, and forming a plasma from said cleaning gases; and (f) removing from said chamber a volatile product of said residue formed by an interaction with said residue and at least one of said cleaning gases.

18. The method of claim 17 wherein step (d) is performed for more than two wafers.

19. The method of claim 17 wherein step (d) is performed for more than five wafers.

20. The method of claim 17 wherein said chamber is maintained at a pressure ranging from about 2 to about 6 Torr.

21. The method of claim 17 wherein said chamber includes a susceptor maintained at a temperature of about 300 to about 500° C.

22. The method of claim 17 wherein said $N_2$ is provided at a flow rate of about 250 to about 350 sccm.

23. The method of claim 17 wherein said $C_2F_6$ and said $O_2$ are provided at a flow rate ratio ($C_2F_2:O_2$) of about 1:1.

24. The method of claim 17 wherein said $O_2$ is provided at a flow rate of about 550 to about 650 sccm.

25. The method of claim 17 wherein said chamber includes electrodes connected to radio frequency power at about 700 to about 2,000 Watts.

26. A method for cleaning a residue from a deposition apparatus, said method comprising steps of:

introducing into a chamber of said deposition apparatus cleaning gases comprising a nitrogen containing compound, a fluorine containing compound, and $O_2$, and forming a plasma from said cleaning gases; and removing from said chamber a volatile product of said residue formed by an interaction with said residue and at least one of said cleaning gases;

wherein said fluorine containing compound is selected from a group consisting of $CF_4$, $C_2F_6$, $C_3F_8$, and $SF_6$.

27. The method of claim 26 wherein said chamber is maintained at a pressure ranging from about 2 to about 6 Torr.

28. The method of claim 26 wherein said chamber includes a susceptor maintained at a temperature of about 300 to about 500° C.

29. The method of claim 26 wherein said nitrogen containing compound is selected from a group containing $N_2$, $NF_3$, and $N_2O$.

30. The method of claim 26 wherein said $C_2F_6$ and said $O_2$ are provided at a flow rate ratio ($C_2F_2:O_2$) of about 1:1.

31. A method for cleaning a residue from a deposition apparatus, said method comprising steps of:

introducing into a chamber of said deposition apparatus cleaning gases comprising a nitrogen containing compound, a fluorine containing compound, and $O_2$, and forming a plasma from said cleaning gases; and removing from said chamber a volatile product of said residue formed by an interaction with said residue and at least one of said cleaning gases;

wherein said nitrogen containing compound is selected from a group consisting of $N_2$, $NF_3$, and $N_2O$.

32. The method of claim 31 wherein said fluorine containing compound is selected from a group consisting of $CF_4$, $C_2F_6$, $C_3F_8$, and $SF_6$.

* * * * *